United States Patent

Häkkinen et al.

Patent Number: 5,839,059
Date of Patent: Nov. 17, 1998

[54] METHOD FOR STARTING A RADIO TRANSMITTER, AND A RADIO TRANSMITTER USING A START-UP ESTIMATED CONTROL VOLTAGE NEEDED FOR LOCKING ONTO SELECTED OUTPUT FREQUENCY

[75] Inventors: Hannu Häkkinen; Jarmo Mäkinen; Mikko Toivonen, all of Espoo, Finland

[73] Assignee: Nokia Telecommunications OY, Espoo, Finland

[21] Appl. No.: 549,773

[22] PCT Filed: May 13, 1994

[86] PCT No.: PCT/FI94/00193

§ 371 Date: Feb. 29, 1996

§ 102(e) Date: Feb. 29, 1996

[87] PCT Pub. No.: WO94/27372

PCT Pub. Date: Nov. 24, 1994

[30] Foreign Application Priority Data

May 14, 1993 [FI] Finland ..................................... 932204

[51] Int. Cl.⁶ .................................................... H04B 17/00
[52] U.S. Cl. .............................. 455/115; 455/75; 455/119; 455/127; 331/176
[58] Field of Search .................................. 455/75, 76, 77, 455/91, 92, 113, 114, 115, 117, 118, 119, 260, 264, 127, 67.1, 343; 331/14, 16, 25, 44, 68, 69, 176, 177 R

[56] References Cited

U.S. PATENT DOCUMENTS

| | | | |
|---|---|---|---|
| 4,254,504 | 3/1981 | Lewis et al. | 455/76 |
| 4,511,858 | 4/1985 | Charavit et al. | 331/25 |
| 4,731,870 | 3/1988 | Black et al. | 455/113 |
| 4,746,879 | 5/1988 | Ma et al. | 331/176 |
| 4,839,613 | 6/1989 | Echols et al. | 331/176 |
| 4,893,097 | 1/1990 | Zwack | 331/176 |
| 4,910,473 | 3/1990 | Niwa | 331/176 |
| 5,379,453 | 1/1995 | Tigwell | 455/92 |

FOREIGN PATENT DOCUMENTS

| | | | |
|---|---|---|---|
| 310 863 | 4/1989 | European Pat. Off. | |
| 40 31 939 | 5/1992 | Germany | |
| 0126713 | 6/1987 | Japan | 331/176 |
| 93 15555 | 8/1993 | WIPO | |
| 93 20619 | 10/1993 | WIPO | |

Primary Examiner—Thanh Cong Le
Attorney, Agent, or Firm—Pillsbury Madison and Sutro LLP

[57] ABSTRACT

When starting a radio transmitter, a transmission frequency is generated by a phase/frequency-locked loop which includes a phase/frequency comparator, a loop filter and a voltage-controlled oscillator. The start-up is performed by switching on an operating voltage to the voltage-controlled oscillator. To minimize the frequency error of the transmitter at start-up, measuring data about relationship between the control voltage of the oscillator and the output frequency of the oscillator at a specified calibration temperature are pre-stored in connection with the oscillator, and immediately before switching on the operating voltage, the control voltage needed for locking onto the selected output frequency at the prevailing temperature is estimated and the estimated control voltage is set as the control voltage of the oscillator.

6 Claims, 2 Drawing Sheets

METHOD FOR STARTING A RADIO TRANSMITTER, AND A RADIO TRANSMITTER USING A START-UP ESTIMATED CONTROL VOLTAGE NEEDED FOR LOCKING ONTO SELECTED OUTPUT FREQUENCY

BACKGROUND OF THE INVENTION

The invention relates to a method for starting a radio transmitter and to a radio transmitter using at start-up an estimated control voltage needed for locking onto a selected output frequency.

In a radio transmitter in which the transmission frequency is generated by a phase/frequency-locked loop, the output frequency of a voltage-controlled oscillator of the loop immediately after the start-up is undetermined. The output frequency is determined in accordance with the control voltage of the voltage-controlled oscillator, which is undetermined at the start-up of the radio transmitter. If there is no way of attenuating or muting a signal transmitted to an antenna for the duration of the start-up of the transmitter, it is yet desirable that the time needed for the oscillator to settle at the correct frequency will be as short as possible and the frequency error at the start-up as small as possible, whereby the frequency of the oscillator will lock over as narrow a frequency band as possible onto the desired frequency.

When a radio transmitter is started, it takes a while before the transmission frequency generated by the oscillator has settled at the correct value. If the radio transmitter is not provided with a separate transmission power muting operation (TXMUTE), in which the transmission power of the transmitter is muted at the start-up by means of electrically controllable attenuators and by controlling the operating voltages of the power amplifiers until the transmission frequency has settled at the correct value, then the radio transmitter interferes with the traffic at the adjacent frequencies during the short settling period.

Instead of the above-mentioned muting switch implemented by means of controllable attenuators and control of the operating voltages of the power amplifiers, a narrow-band channel filter can also be used in the radio transmitter, the narrow-band channel filter decreasing interference at the start-up. The drawback of this solution is that it is only suitable for lower frequencies since at higher frequencies the filter cannot be rendered sufficiently narrow-band.

The interference at the start-up is rather expensive to minimize by the above-described muting switch, which does not have the drawbacks of the channel filter. Further, in most applications the muting operation of the transmitter is needed very seldom. In particular, this applies to radio link applications in which the radio transmitter is started very seldom. In practice, the same transmitter may be in operation even for several years without interruption.

SUMMARY OF THE INVENTION

The object of the present invention is to eliminate the above described drawbacks and to provide a method that minimizes the frequency error of the radio transmitter at the start-up and enables minimizing of the interference with the neighbouring channels at the start-up without separate transmission power muting operations. This is achieved with the method according to the invention, and by the radio transmitter according to the invention.

The idea of the invention is to start the voltage-controlled oscillator of the phase/frequency-locked loop used in generating the transmission frequency of the transmitter at the correct frequency by estimating its control voltage as accurately as possible and by setting the control voltage at the estimated value immediately before the transmitter is started by switching on an operating voltage to the voltage-controlled oscillator.

The solution according to the invention enables minimizing of the interference with the other radio traffic without the use of expensive attenuators.

Further, a separate antenna switch is not needed in the transmitter according to the invention for disconnecting the antenna from the transmitter when the frequency settles at its correct value, but the transmitter can be directly connected to the antenna.

BRIEF DESCRIPTION OF THE DRAWINGS

In the following, the invention and the advantageous embodiments thereof will be described in greater detail with reference to the examples according to the attached drawings, wherein.

DETAILED DESCRIPTION

Figure 1:
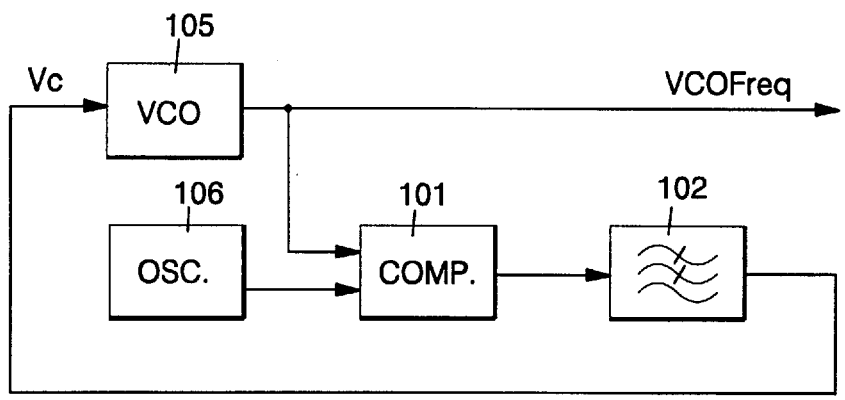
FIG. 1 shows a phase/frequency-locked loop known per se.

FIG. 1 shows a phase- or frequency-locked loop, which comprises, as known per se, a phase/frequency comparator 101, a low pass-type loop filter 102 to the input of which is connected the output signal of the phase/frequency comparator, and a voltage-controlled oscillator 105 whose output signal is connected to a first input of the phase/frequency comparator. To the second input of the phase comparator is connected a reference signal obtained, e.g. from a reference oscillator 106. The phase/frequency comparator compares the frequency and/or phase of the input signals and generates a control signal proportional to the phase or frequency difference of the signals, the control signal being low pass filtered by a loop filter to produce a control signal Vc. In the phase/frequency-locked loop presented in FIG. 1, the output frequency VCOFreq of the oscillator 105 immediately after the start-up of the oscillator is undetermined. The output frequency is determined in accordance with the control voltage Vc of the voltage-controlled oscillator, and the voltage obtained from the loop filter at the start-up is undetermined. After the start-up, the phase/frequency comparator of the loop corrects the frequency error and locks the frequency or frequency and phase of the voltage-controlled oscillator onto the frequency or frequency and phase of the reference signal.

In the present, invention the radio transmitter is started by switching on the operating voltage to the voltage-controlled oscillator, and the above-described locking operation is speeded by presetting the control voltage Vc of the oscillator immediately before switching on the operating voltage to the oscillator. In many VCO solutions, the frequency determined by the oscillator can be controlled fairly accurately in this manner (by pre-tuning the resonator circuit) right from the start-up. After the start-up, the phase/frequency comparator of the loop quickly phase- or frequency-locks the oscillator.

The above described technique applies both to a phase-locked and to a frequency-locked oscillator, whereby the above-described phase/frequency comparator may be either a phase comparator (whereby it comprises both frequency and phase detectors) or a frequency comparator (whereby it comprises a frequency detector only). A frequency-locked oscillator is thus an oscillator whose frequency is locked onto a reference signal but whose phase may drift (slowly) in relation to the phase of the reference signal. A loop that implements frequency-locking (and does not comprise a phase comparator) is here called a frequency-locked loop. (In some embodiments it may be reasonable to omit the phase detector and thereby simplify the structure of the apparatus.)

The (output) frequency VCOFreq of the voltage-controlled oscillator 105 is directly dependent on the control voltage Vc controlling it. This may be presented by formula (1), when the temperature VCOTemp is a constant:

$$\text{VCOFreq} = f_1(Vc); \quad \text{VCOTemp} = \text{constant}. \tag{1}$$

The frequency VCOFreq is not dependent on the control voltage Vc in a linear manner, however, and it is also dependent on the temperature. This correlation may be presented by formula (2):

$$\text{VCOFreq} = f_2(Vc, \text{VCOTemp}). \tag{2}$$

Figure 2:
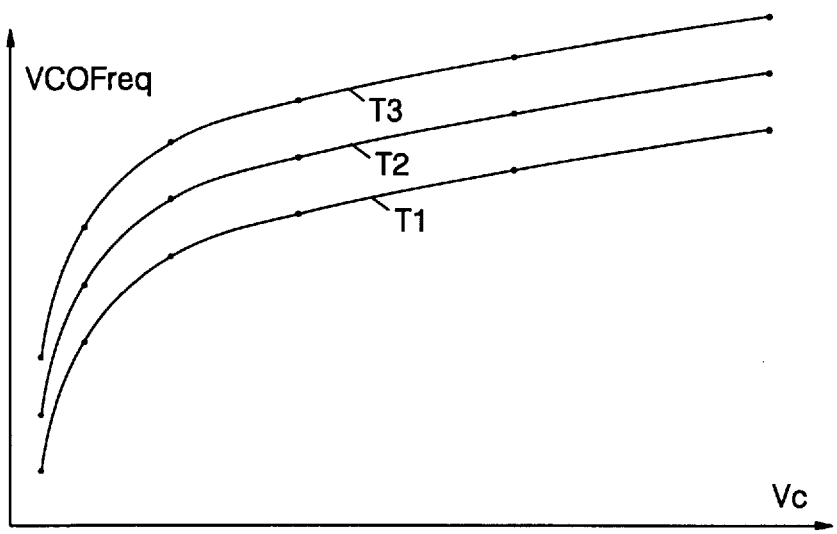
FIG. 2 illustrates correlation between the output frequency and control voltage of the voltage-controlled oscillator of the transmitter at different temperatures.

However, temperature dependence can often be assumed to be linear and characteristic of the oscillator embodiment concerned, whereby the curves measured at different temperatures are similar in shape. This appears from FIG. 2, in which the horizontal axis stands for the control voltage Vc and the vertical axis for the output frequency VCOFreq of the oscillator. The first curve is measured at a temperature T1, the second at a temperature T2 and the third at a temperature T3 (T2=T1+ΔT and T3=T2+ΔT). As can be seen from the figure, the temperature correlation is linear, i.e. the curves are similar in shape and the change in the output frequency is of the same magnitude as the change in the temperature is of the same magnitude (ΔT). Thereby, it is possible to derive formula (3):

$$\text{VCOFreq} = f_3(Vc) + \text{VCOTemp} \ast k1, \tag{3}$$

wherein k1 is a constant. On the other hand, it is also possible to form inverse functions of formulae (1)–(3):

$$Vc = f_1^{-1}(\text{VCOFreq}); \quad \text{VCOTemp} = \text{constant, and} \tag{4}$$

$$Vc = f_2^{-1}(\text{VCOFreq}, \text{VCOTemp}), \tag{5}$$

$$Vc = f_3^{-1}(\text{VCOFreq} - \text{VCOTemp} \ast k1). \tag{6}$$

In the above presented formulae, functions are indicated by $f_1$, $f_2$ and $f_3$, and their inverse functions by $f_1^{-1}$, $f_2^{-1}$ and $f_3^{-1}$, respectively.

When the relationship according to formula (4) at a specified temperature is known, and the constant k1 of formula (6) and the temperature difference in regard to the temperature of the known relationship is also known, the control voltage needed for generating a desired frequency can be calculated. The more general situation according to formula (5) can also often be modelled such that the temperature dependence is known and characteristic of the oscillator embodiment concerned.

In accordance with the invention, the control voltage of the oscillator is estimated before starting the transmitter on the basis of the desired frequency, the prevailing temperature and the relationship according to known formula (5) or (6). The control voltage is set at the calculated value and the transmitter is not started until after this by switching on the operating voltage to the voltage-controlled oscillator, whereby the oscillator starts to operate as close to the desired transmission frequency as possible and locks onto the correct frequency in as short a time as possible, sweeping over as narrow a frequency band as possible.

Figure 3:
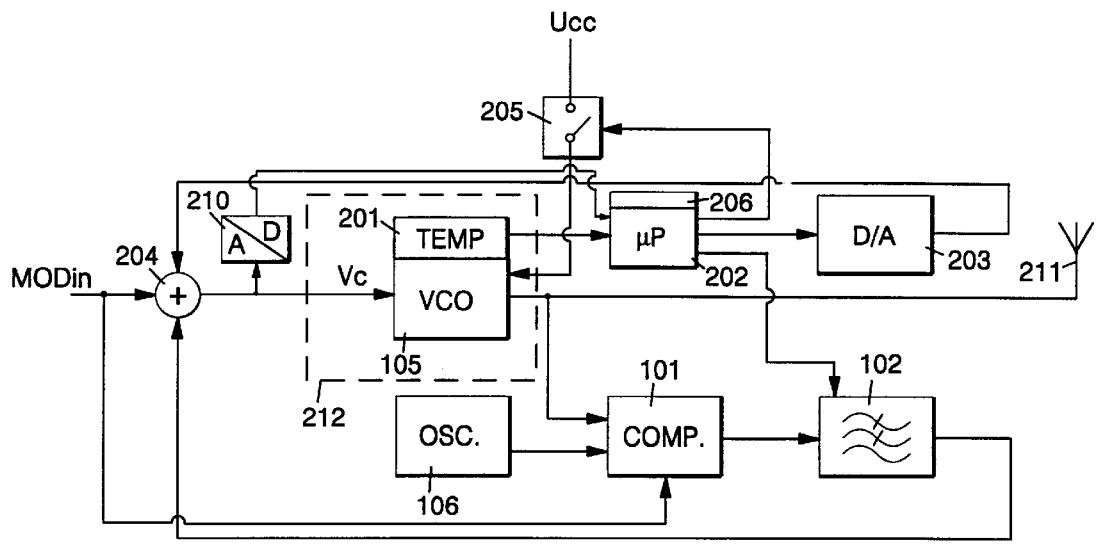
FIG. 3 shows a first embodiment of a radio transmitter according to the invention.

FIG. 3 shows a first embodiment of radio transmitting equipment according to the invention. Like reference numerals are used as above, and only the essential elements of the invention are shown in the figure. The voltage-controlled oscillator 105 is here provided with a temperature sensor 201, which measures the prevailing temperature. The output of the temperature sensor is connected to a microprocessor 202, which provides a numeric value of the control voltage of the oscillator, the value being supplied to a D/A converter 203, which converts the control voltage to analog form and supplies it further to a first input of an adder 204. The microprocessor 202 also controls a switch 205 that starts the transmitter by switching on an operating voltage Ucc to the oscillator. The microprocessor is also connected to the loop filter 102 to force the output signal of the filter to assume a constant value (e.g. zero) when no operating voltage is switched on to the oscillator 105. Between the output of the adder and microprocessor is connected an A/D converter 210 by means of which the control voltage Vc of the oscillator is measured.

In the transmitter equipment according to FIG. 3, the relationship according to formula (4) is measured at a specified temperature. The measuring is performed at sufficiently many frequencies to settle the parameters of the model. In the simplest solution, linear interpolation or a polynomial model may be used. The resultant relationship and the prevailing temperature are stored in a non-volatile memory 206 arranged in connection with the microprocessor. The storing may be implemented, e.g. as a table in accordance with the measured frequency raster, from which table a control voltage corresponding to the desired output frequency is interpolated.

Prior to the start-up of the transmitter, the microprocessor 202 calculates the control voltage of the oscillator on the basis of the desired output frequency, the temperature measured with the sensor 201 and the relationship measured. The resultant voltage is set as the oscillator control voltage by supplying it through the D/A converter 203 to the first input of the adder 204. (At the same time, the microprocessor 202 maintains the output voltage of the loop filter at the aforementioned constant value in order that it not interfere with the pre-tuning of the oscillator. When the control voltage Vc is set at the calculated value, the microprocessor switches on the operating voltage Ucc to the oscillator by controlling the switch 205 in a closed position. Forced control of the loop filter is simultaneously removed. The loop subsequently locks the phase or frequency of the output signal of the oscillator onto the phase or frequency of the reference signal.

At the start-up, the reference oscillator 106 may already be on, i.e. it does not require separate control at the start-up but can be switched on e.g. simultaneously with the microprocessor 202.

In an advantageous embodiment of the invention, the oscillator 105 and temperature sensor 201 are placed in an oven, which is indicated by reference number 212 in FIG. 3. The relationship according to formula (4) is measured at a temperature that corresponds to the oven temperature to minimize the effect of the temperature on the estimation error. Even when an oven is not used, it is advantageous to measure the relationship between the output frequency and control voltage (formula 4) at the average operating temperature.

When the transmission frequency is generated in the above described manner by means of a pre-tuned oscillator, the transmitter settles at the correct channel after the start-up as soon as possible. The oscillator 105 can be modulated directly and a radio frequency can be formed by it. FIG. 3 shows this alternative, and in it the modulating signal MODin is supplied directly to the adder 204 (and to the phase/frequency comparator) and the output signal of the oscillator is connected directly (or through possible amplification stages) to a transmitting antenna 211.

Figure 4:
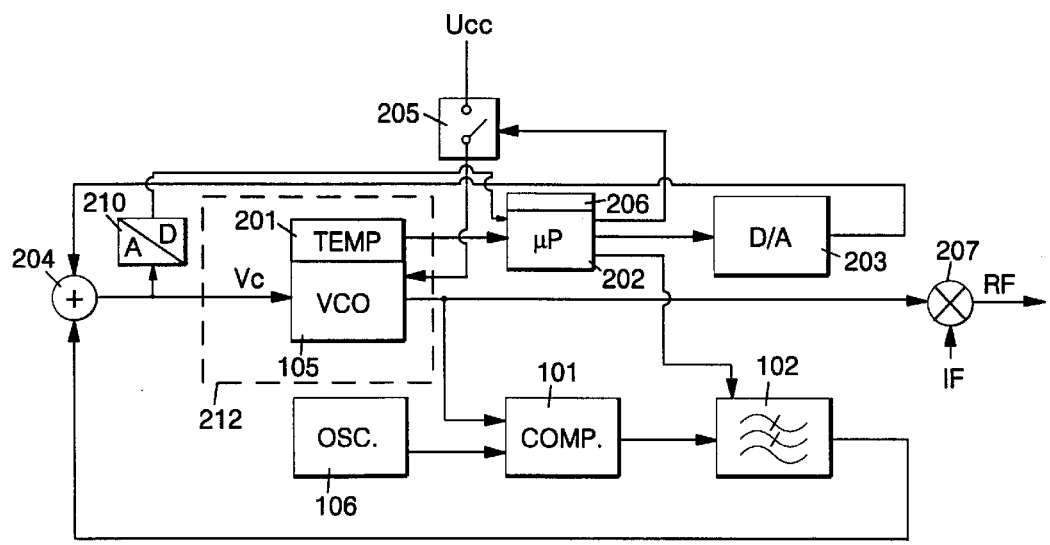
FIG. 4 shows a second embodiment of a radio transmitter according to the invention.

In another embodiment of the transmitter, shown in FIG. 4, the oscillator 105 operates as a local oscillator of the transmitter: the output signal of the oscillator is connected to a mixer 207 of the transmitter, to which is also supplied an intermediate frequency signal IF obtained from the modulator of the transmitter (not shown). From the output of the mixer is obtained a radio frequency transmission signal, which is connected through possible amplification stages to the transmitting antenna 211 (not shown in FIG. 4). The embodiment of FIG. 4 is a secondary alternative in respect of the invention since in this embodiment it is possible to avoid the problem described in the beginning by disconnecting the intermediate frequency signal IF for the duration of the start-up operation, thereby preventing the access of the transmission signal to the antenna during the start-up.

Although the invention is described above with reference to the examples according to the attached drawings, it is to be understood that the invention is not restricted thereto but can be modified in many ways within the scope of the inventive idea disclosed above and in the attached claims. The phase/frequency-locked loop used in the transmitter is presented in its basic form, and e.g. frequency dividers typically found at the inputs of the comparator have not been presented. Also in other respects a more detailed implementation of the loop may vary in many ways.

We claim:

1. A method for starting a radio transmitter comprising a voltage-controlled oscillator (VCO), the VCO being included in a phase/frequency-locked loop which also includes a phase/frequency comparator and a loop filter serving a radio transmitter in a telecommunications system, in varying temperatures, without generating at start-up frequencies different from a desired transmission frequency such as would interfere with neighboring channels, comprising storing measured data about a relationship between a control voltage for the VCO and a corresponding output frequency of the VCO at specified calibration temperatures;

determining a prevailing VCO temperature;

estimating a start-up control voltage needed to lock said VCO onto a selected output frequency at the prevailing VCO temperature, said start-up control voltage being determined based on (a) a desired output frequency of said VCO, (b) said stored measured data, and (c) temperature-compensation information, thereby obtaining an estimated control voltage such that a start-up frequency of said VCO corresponding to said estimated start-up control voltage will not interfere with neighboring channels; and setting said estimated start-up control voltage as the control voltage for said VCO by switching said estimated start-up control voltage to said VCO and immediately thereafter switching on the operating voltage of the VCO.

2. A method according to claim 1 further including:

maintaining the temperature of the VCO substantially constant by heating said VCO using an oven.

3. A method according to claim 2, wherein:

said maintaining includes maintaining the temperature of the oven substantially at said specified calibration temperature.

4. A radio transmitter for a telecommunications system for use at varying temperatures without generating at start-up frequencies different from a desired transmission frequency such as would interfere with neighboring channels, the transmitter comprising:

a phase/frequency-locked loop, which comprises a phase/frequency comparator, a loop filter and a voltage-controlled oscillator (VCO), said loop being arranged to generate the transmission frequency of said radio transmitter generated by said phase/frequency-locked loop;

means for switching on an operating voltage to said VCO so as to start-up said radio transmitter;

storing means arranged for storing measured data about a relationship between a control voltage of said VCO and a corresponding output frequency of said VCO at a specified calibration temperature;

temperature measuring means for measuring a prevailing temperature of said voltage-controlled oscillator;

calculating means operatively connected to said storing means and said measuring means for estimating a start-up control voltage for said VCO on the basis of (a) a desired output frequency of said VCO, (b) said stored measured data, and (c) a difference between the prevailing temperature as measured by said temperature measuring means and said specified calibration temperature, thereby determining an estimated value for the control voltage such that a start-up frequency corresponding to said estimated start-up control voltage will not interfere with neighboring channels; and setting means responsive to said calculating means for providing a control voltage to said VCO on the basis of said estimated start-up control voltage, said means for switching on said operating voltage being responsive to said setting means, for performing said start-up immediately after the control voltage has been set to said estimated start-up control voltage value.

5. A radio transmitter according to claim 4, further comprising:

means for providing said measured data.

6. A radio transmitter according to claim 4, further comprising:

an oven;

said VCO and said temperature measuring means being heated by said oven so as to maintain said VCO at a substantially constant temperature.

* * * * *